United States Patent
Xia

(10) Patent No.: US 11,308,827 B2
(45) Date of Patent: Apr. 19, 2022

(54) FLEXIBLE DISPLAY DEVICE HAVING VISCOELEASTIC FLUID LAYERS

(71) Applicant: WUHAN CHINA STAR OPTOELECTRONICS SEMICONDUCTOR DISPLAY TECHNOLOGY CO., LTD., Wuhan (CN)

(72) Inventor: Mingyong Xia, Wuhan (CN)

(73) Assignee: WUHAN CHINA STAR OPTOELECTRONICS SEMICONDUTOR DISPLAY TECHNOLOGY CO., LTD., Wuhan (CN)

(*) Notice: Subject to any disclaimer, the term of this patent is extended or adjusted under 35 U.S.C. 154(b) by 491 days.

(21) Appl. No.: 16/344,857

(22) PCT Filed: Jan. 25, 2019

(86) PCT No.: PCT/CN2019/073235
§ 371 (c)(1),
(2) Date: Apr. 25, 2019

(87) PCT Pub. No.: WO2020/124741
PCT Pub. Date: Jun. 25, 2020

(65) Prior Publication Data
US 2021/0358341 A1 Nov. 18, 2021

(30) Foreign Application Priority Data
Dec. 19, 2018 (CN) .......................... 201811555637.1

(51) Int. Cl.
*H01L 27/14* (2006.01)
*H01L 27/32* (2006.01)
(Continued)

(52) U.S. Cl.
CPC .......... *G09F 9/301* (2013.01); *H01L 51/0097* (2013.01); *H01L 51/5237* (2013.01);
(Continued)

(58) Field of Classification Search
CPC . G09F 9/301; H01L 27/14678; H01L 27/323; H01L 51/0097; H01L 51/5237;
(Continued)

(56) References Cited

U.S. PATENT DOCUMENTS 7,944,521 B2* 5/2011 Ichioka ............. G02F 1/133308
349/58
9,865,844 B1* 1/2018 Park ................... H01L 51/5284
(Continued)

FOREIGN PATENT DOCUMENTS

CN 105228823 A 1/2016
CN 107545847 A 1/2018
(Continued)

*Primary Examiner* — Ida M Soward
(74) *Attorney, Agent, or Firm* — Osha Bergman Watanabe & Burton LLP

(57) ABSTRACT

A flexible display device is provided. The flexible display device includes a housing, a flexible display panel, a cover window, and a first viscoelastic fluid layer. The flexible display panel is disposed on the housing. The cover window is disposed on the flexible display panel. The first viscoelastic fluid layer is disposed between the cover window and the flexible display panel.

18 Claims, 3 Drawing Sheets

(51) Int. Cl.
- *H01L 51/00* (2006.01)
- *H01L 51/52* (2006.01)
- *G02F 1/133* (2006.01)
- *G09F 9/30* (2006.01)
- *G02F 1/1333* (2006.01)
- *G02F 1/1335* (2006.01)
- *H01L 27/146* (2006.01)

(52) U.S. Cl.
CPC .... *H01L 51/5293* (2013.01); *G02F 1/133331* (2021.01); *G02F 1/133528* (2013.01); *H01L 27/14678* (2013.01); *H01L 27/323* (2013.01); *H01L 51/5246* (2013.01); *H01L 51/5253* (2013.01); *H01L 2251/5338* (2013.01)

(58) Field of Classification Search
CPC ............. H01L 51/5246; H01L 51/5253; H01L 51/5293; H01L 2251/5338; G02F 1/133331; G02F 1/133528
See application file for complete search history.

(56) References Cited

U.S. PATENT DOCUMENTS

| | | | |
|---|---|---|---|
| 10,288,974 B2* | 5/2019 | Hou | G02F 1/133305 |
| 10,483,210 B2* | 11/2019 | Gross | C03C 17/326 |
| 11,127,924 B2* | 9/2021 | Hao | H01L 51/00 |
| 2016/0009593 A1 | 1/2016 | Brychell et al. | |
| 2016/0202782 A1* | 7/2016 | Park | G06F 3/0443 345/173 |
| 2017/0271616 A1* | 9/2017 | Choi | H01L 51/0097 |
| 2017/0293194 A1* | 10/2017 | Hou | H01L 51/0097 |
| 2017/0373281 A1 | 12/2017 | Park et al. | |
| 2018/0090702 A1* | 3/2018 | Um | H01L 51/5253 |
| 2018/0150106 A1* | 5/2018 | Jang | G06F 1/1652 |
| 2018/0348567 A1 | 12/2018 | Shin et al. | |

FOREIGN PATENT DOCUMENTS

| | | |
|---|---|---|
| CN | 108122491 A | 6/2018 |
| CN | 108922963 A | 11/2018 |
| CN | 108986659 A | 12/2018 |

\* cited by examiner

FLEXIBLE DISPLAY DEVICE HAVING
VISCOELEASTIC FLUID LAYERS

FIELD OF INVENTION

The present disclosure relates to the field of display technologies, and more particularly to a flexible display device.

BACKGROUND OF INVENTION

At present, people are increasingly relying on electronic products such as mobile phones, tablet computers, and smart wearable devices. In order to enhance user experiences and enhance product competitiveness, an adoption of large screens has become a development trend. For an inconvenience of large-screen electronic devices, flexible foldable display devices have emerged, which can fold the mobile devices into a small-sized form. With a development of flexible foldable display technologies, structural studies of flexible foldable display devices are also underway.

In order to meet requirements of bending properties, current flexible foldable display devices have softer material layers, no outer glass protection, and poor impact resistance. Moreover, a curved portion of the flexible foldable display device is driven by a hinge to assist a pulling of a screen during bending, but in a flattened state, a middle portion of the flexible foldable display device lacks support, and therefore, when the flexible foldable display device is dropped, an impact of a hinge damage on an entire flexible foldable display device is also fatal.

Therefore, there is a need to provide a flexible display device to solve issues of the prior art.

SUMMARY OF INVENTION

To solve the above technical problem, the present disclosure provides a flexible display device. The flexible display device includes a housing, a flexible display panel, a cover window, and a first viscoelastic fluid layer. The flexible display panel is disposed on the housing. The cover window is disposed on the flexible display panel. The first viscoelastic fluid layer is disposed between the cover window and the flexible display panel. A thickness of the first viscoelastic fluid layer is less than or equal to 25 µm. A dispersion system of the first viscoelastic fluid layer includes a plurality of reinforcing particles and an organic solvent, the reinforcing particles are distributed in the organic solvent, and a matrix structure of the first viscoelastic fluid layer is a fiber structure.

In an embodiment of the present disclosure, the flexible display panel includes a flexible substrate, an organic light emitting layer, and an encapsulation layer disposed in sequence from bottom to top, and the first viscoelastic fluid layer is disposed between the cover window and the encapsulation layer.

In an embodiment of the present disclosure, the flexible display panel includes a flexible substrate, an organic light emitting layer, an encapsulation layer, and a polarizer disposed in sequence from bottom to top, and the first viscoelastic fluid layer is disposed between the cover window and the polarizer.

In an embodiment of the present disclosure, the flexible display panel includes a flexible substrate, an organic light emitting layer, an encapsulation layer, a polarizer, and a touch layer disposed in sequence from bottom to top, and the first viscoelastic fluid layer is disposed between the cover window and the touch layer.

In an embodiment of the present disclosure, the flexible display device further includes a hinge structure and a second viscoelastic fluid layer each disposed in the housing, the hinge structure is disposed between the flexible display panel and the second viscoelastic fluid layer, the first viscoelastic fluid layer is a first non-Newtonian fluid layer, and the second viscoelastic fluid layer is a second non-Newtonian fluid layer.

In an embodiment of the present disclosure, materials of the first non-Newtonian fluid layer and the second non-Newtonian fluid layer include a polymer and a plurality of reinforcing particles.

In an embodiment of the present disclosure, a particle diameter of a single of the reinforcing particles is less than or equal to 10 µm.

In an embodiment of the present disclosure, a ratio of the reinforcing particles to the organic solvent is 2:1.

The present disclosure further provides a flexible display device. The flexible display device includes a housing, a flexible display panel, a cover window, and a first viscoelastic fluid layer. The flexible display panel is disposed on the housing. The cover window is disposed on the flexible display panel. The first viscoelastic fluid layer is disposed between the cover window and the flexible display panel.

In an embodiment of the present disclosure, the flexible display panel includes a flexible substrate, an organic light emitting layer, and an encapsulation layer disposed in sequence from bottom to top, and the first viscoelastic fluid layer is disposed between the cover window and the encapsulation layer.

In an embodiment of the present disclosure, the flexible display panel includes a flexible substrate, an organic light emitting layer, an encapsulation layer, and a polarizer disposed in sequence from bottom to top, and the first viscoelastic fluid layer is disposed between the cover window and the polarizer.

In an embodiment of the present disclosure, the flexible display panel includes a flexible substrate, an organic light emitting layer, an encapsulation layer, a polarizer, and a touch layer disposed in sequence from bottom to top, and the first viscoelastic fluid layer is disposed between the cover window and the touch layer.

In an embodiment of the present disclosure, the flexible display device further includes a hinge structure and a second viscoelastic fluid layer each disposed in the housing, the hinge structure is disposed between the flexible display panel and the second viscoelastic fluid layer, the first viscoelastic fluid layer is a first non-Newtonian fluid layer, and the second viscoelastic fluid layer is a second non-Newtonian fluid layer.

In an embodiment of the present disclosure, materials of the first non-Newtonian fluid layer and the second non-Newtonian fluid layer include a polymer and a plurality of reinforcing particles.

In an embodiment of the present disclosure, a thickness of the first viscoelastic fluid layer is less than or equal to 25 µm.

In an embodiment of the present disclosure, a dispersion system of the first viscoelastic fluid layer includes a plurality of reinforcing particles and an organic solvent, the reinforcing particles are distributed in the organic solvent, and a matrix structure of the first viscoelastic fluid layer is a fiber structure.

In an embodiment of the present disclosure, a particle diameter of a single of the reinforcing particles is less than or equal to 10 μm.

In an embodiment of the present disclosure, a ratio of the reinforcing particles to the organic solvent is 2:1.

Compared with the prior art, in order to solve the above technical problem, in the flexible display device of the embodiment of the present disclosure, the first viscoelastic fluid layer is disposed between the cover window and the flexible display panel. The first viscoelastic fluid layer has flexibility under normal conditions and can meet requirements of dynamic bending. When the first viscoelastic fluid layer is subjected to external impact, the first viscoelastic fluid layer has characteristics of shear thickening, which can effectively block external impact force and protect the flexible display device. By filling the second viscoelastic fluid layer in the housing provided with the hinge structure, damage of the hinge structure due to dropping can be reduced, and a service life of the flexible display device can be improved.

DETAILED DESCRIPTION OF PREFERRED EMBODIMENTS

Figure 1:
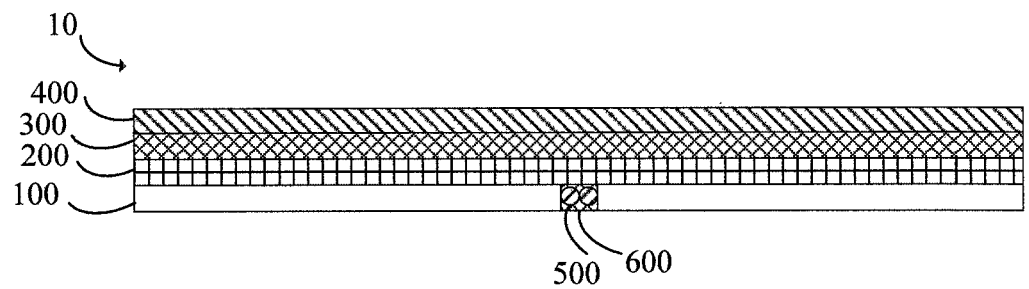
FIG. 1 is a schematic view of an unfolded state a flexible display device according to an embodiment of the present disclosure.

The following description of the various embodiments is provided to illustrate the specific embodiments with reference to the accompanying drawings.

In order to make the above description of the present disclosure and other objects, features, and advantages of the present disclosure more comprehensible, preferred embodiments are described below, and are described in detail below with reference to the accompanying drawings. Furthermore, directional terms described by the present disclosure, such as up, down, top, bottom, front, back, left, right, inner, outer, side, surrounding, center, horizontal, vertical, longitudinal, axial, radial, uppermost or lowermost, etc., are only directions by referring to the accompanying drawings, and thus the used terms are used only for the purpose of describing embodiments of the present disclosure and are not intended to be limiting of the present disclosure.

In the drawings, units with similar structures are labeled with the same reference number.

Figure 2:
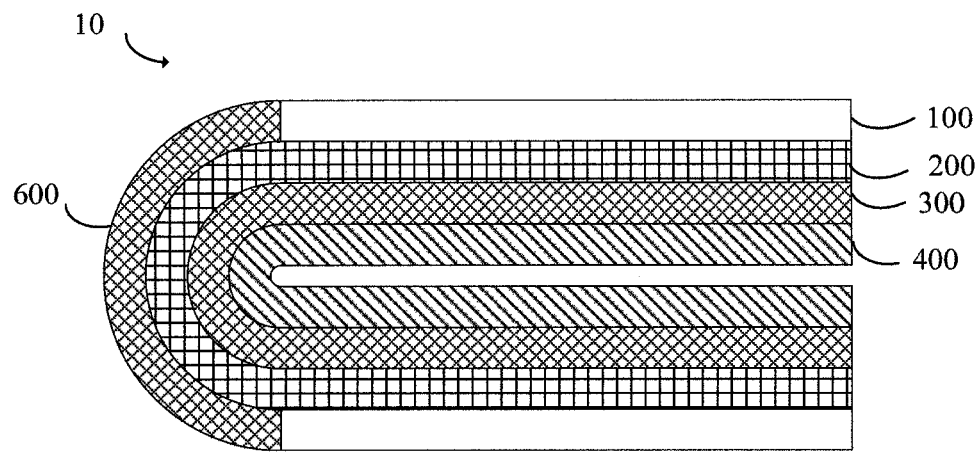
FIG. 2 is a schematic view of a folded state of a flexible display device according to an embodiment of the present disclosure.
Figure 3:
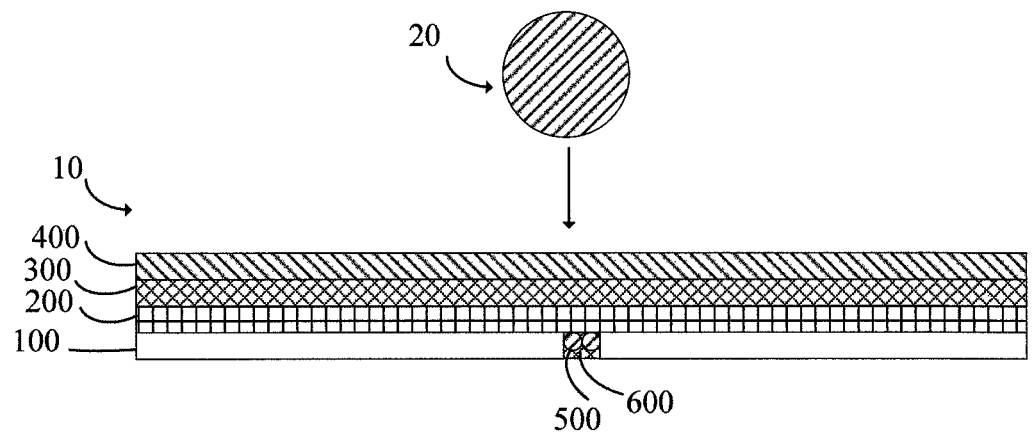
FIG. 3 is a schematic view illustrating changes in a flexible display device when subjected to an impact according to an embodiment of the present disclosure.

Referring to FIGS. 1 to 3, a flexible display device 10 of an exemplary embodiment of the present disclosure includes a housing 100, a flexible display panel 200, a cover window 300, and a first viscoelastic fluid layer 400. The flexible display panel 200 is disposed on the housing 100. The cover window 300 is disposed on the flexible display panel 200. The first viscoelastic fluid layer 400 is disposed between the cover window 300 and the flexible display panel 200.

The flexible display device 10 can be, for example, an organic light emitting diode device, and can be applied to electronic devices such as mobile phones, televisions, and tablet computers. Unfolded and folded states of the flexible display device 10 are illustrated in FIG. 1 and FIG. 2. The first viscoelastic fluid layer 400 has flexibility when a user bends the first viscoelastic fluid layer 400 normally, which can assist a bending of the flexible display panel 200. When the flexible display device 10 is subjected to an external impact, as illustrated in FIG. 3, the flexible display device 10 has a good resistance to deformation. The first viscoelastic fluid layer 400 is disposed between the cover window 300 and the flexible display panel 200. The first viscoelastic fluid layer 400 has flexibility under normal conditions and can meet requirements of dynamic bending (exemplified in FIG. 2), can effectively block external impact force 20, and can protect the flexible display device 10 (exemplified in FIG. 3) due to shear thickening when the flexible display device 10 is subjected to an external impact.

The first viscoelastic fluid layer 400 is disposed under the cover window 300, but is not limited thereto, and may be positioned between other film layers of the flexible display device 10 to enhance reliability of the flexible display device 10 when the flexible display device 10 is impacted and dropped, and a falling height of the flexible display device 10 can be improved.

In an embodiment of the present disclosure, the flexible display device 10 further includes a hinge structure 500 and a second viscoelastic fluid layer 600, both of which are disposed in the housing 100. The hinge structure 500 is disposed between the flexible display panel 200 and the second viscoelastic fluid layer 600. The housing is, for example, a metal material to have light weight, bending resistance, and good impact resistance, and a service life of a bending mechanism is improved.

By filling the second viscoelastic fluid layer 600 in the housing 100 provided with the hinge structure 500, damage of the hinge structure 500 due to dropping can be reduced, and a service life of the flexible display device 10 can be improved.

In details, the first viscoelastic fluid layer 400 is a first non-Newtonian fluid layer and the second viscoelastic fluid layer 600 is a second non-Newtonian fluid layer. Materials of the first non-Newtonian fluid layer and the second non-Newtonian fluid layer include a polymer and a plurality of reinforcing particles. For example, the polymer can include high temperature polyimide (PI), the reinforcing particles can include silica, and a diameter of the reinforcing particles is a micron scale. A particle diameter of a single of the reinforcing particles is less than or equal to 10 μm.

A thickness of the first viscoelastic fluid layer 400 is less than or equal to 25 μm. A dispersion system of the first viscoelastic fluid layer 400 includes a plurality of reinforcing particles and an organic solvent, the reinforcing particles are distributed in the organic solvent, and a matrix structure of the first viscoelastic fluid layer 400 is a fiber structure. A particle diameter of a single of the reinforcing particles is less than or equal to 10 μm. A ratio of the reinforcing particles to the organic solvent is 2:1, and the ratio can be adjusted to achieve different use requirements.

Figure 4:
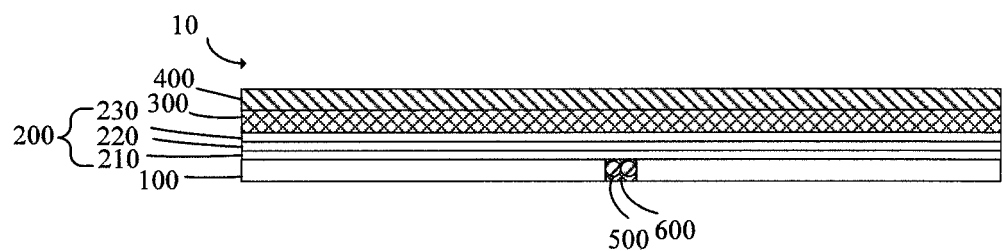
FIG. 4 is a schematic view of an unfolded state a flexible display device according to an embodiment of the present disclosure.

Referring to FIG. 4, in an embodiment of the present disclosure, the flexible display panel 200 includes a flexible substrate 210, an organic light emitting layer 220, and an encapsulation layer 230, which are sequentially disposed from bottom to top. The first viscoelastic fluid layer 400 is disposed between the cover window 300 and the encapsulation layer 230.

Figure 5:
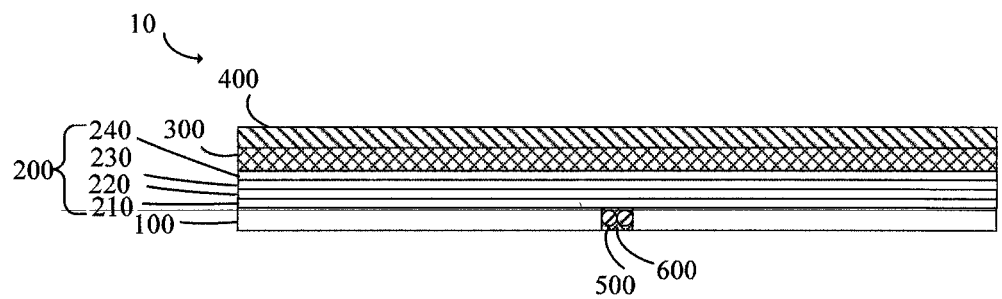
FIG. 5 is a schematic view of an unfolded state a flexible display device according to an embodiment of the present disclosure.

Referring to FIG. 5, in an embodiment of the present disclosure, the flexible display panel 200 includes a flexible substrate 210, an organic light emitting layer 220, an encapsulation layer 230, and a polarizer 240, which are sequentially disposed from bottom to top. The first viscoelastic fluid layer 400 is disposed between the cover window 300 and the polarizer 240. In the embodiment of the present disclosure, the first viscoelastic fluid layer 400 is disposed between the cover window 300 and the polarizer 240, however the first viscoelastic fluid layer 400 is not limited to being disposed between the cover window 300 and the polarizer 240, it may be positioned between other film layers. The first viscoelastic fluid layer 400 may be disposed between the film layers of the flexible display device 10 in a coating manner.

Figure 6:
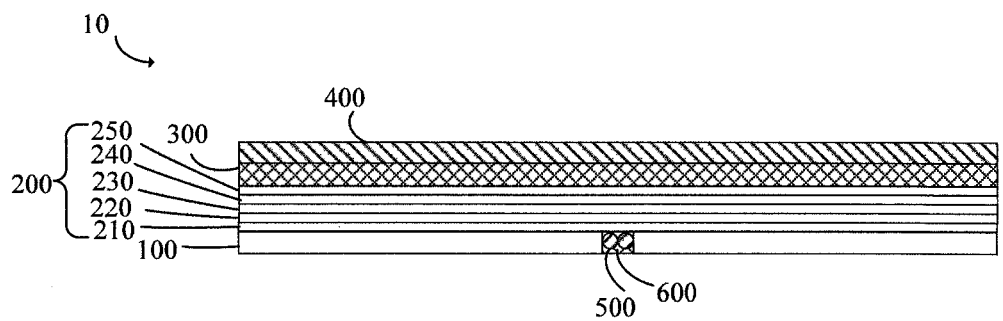
FIG. 6 is a schematic view of an unfolded state a flexible display device according to an embodiment of the present disclosure.

Referring to FIG. 6, in an embodiment of the present disclosure, the flexible display panel 200 includes a flexible substrate 210, an organic light emitting layer 220, an encapsulation layer 230, a polarizer 240, and a touch layer 250 disposed from bottom to top. The first viscoelastic fluid layer 400 is disposed between the cover window 300 and the touch layer 250.

Figure 7:
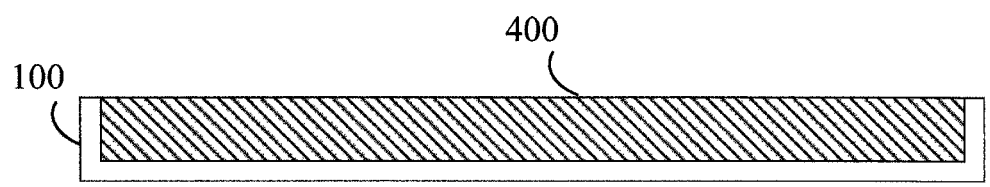
FIG. 7 is a schematic view of a second viscoelastic fluid layer disposed in a housing according to an embodiment of the present disclosure.

FIG. 7 illustrates a schematic view of a second viscoelastic fluid layer disposed in a housing according to an embodiment of the present disclosure.

Referring to FIG. 7, the second viscoelastic fluid layer 600 is disposed in the housing 100. In details, the second viscoelastic fluid layer 600 is surrounded by a bottom surface and a plurality of sidewalls of the housing 100. The second viscoelastic fluid layer 600 is at a same level as the sidewalls of the housing 100.

By filling the second viscoelastic fluid layer 600 in the housing 100 provided with the hinge structure 500, damage of the hinge structure 500 due to dropping can be reduced, and a service life of the flexible display device 10 can be improved.

Figure 8:
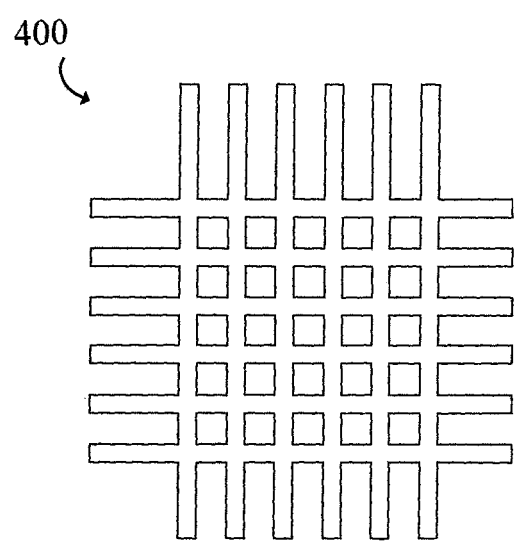
FIG. 8 is a schematic structural diagram of a first viscoelastic fluid layer according to an embodiment of the present disclosure.

FIG. 8 illustrates a schematic structural view of a first viscoelastic fluid layer according to an embodiment of the present disclosure.

Referring to FIG. 8, the first viscoelastic fluid layer 400 has shear thickening characteristics, and a dispersion system of the first viscoelastic fluid layer 400 includes reinforcing particles and an organic solvent. The reinforcing particles of such a dispersion system are used to increase a hardness of the first viscoelastic fluid layer 400 for dispersing a flow of the reinforcing particles to uniformly distribute the reinforcing particles. The reinforcing particles in the non-Newtonian fluid can be extremely fine and uniformly distributed in an organic solvent. Both ends of the first viscoelastic fluid layer 400 may have a barrier layer.

A matrix structure thereof is a fiber structure, and fibers soaked with the dispersion system are highly resistant when subjected to severe impact. Types of the reinforcing particles include, but are not limited to, very fine $SiO_2$ particles, and solvent types include, but are not limited to, polyethylene glycol.

A material of the first viscoelastic fluid layer 400 may be required to have a refractive index and density similar to that of an optically clear adhesive (OCA) to ensure that an overall display performance of the flexible display device 10 is not affected.

In details, the first viscoelastic fluid layer 400 includes two states (a state of flexibility and a state of greater rigidity). When the first viscoelastic fluid layer 400 is not impacted, it maintains softness. When the first viscoelastic fluid layer 400 is subjected to impact, it exhibits a strong shear thickening behavior and a state of greater rigidity.

In details, when the first viscoelastic fluid layer 400 is in a soft state, elastic modulus and Poisson are relatively low, and after a large deformation occurs, an initial state thereof can be restored. The first viscoelastic fluid layer 400 includes, but is not limited to, a porous polymer, a hollow transparent electrode material, and the like.

In details, the first viscoelastic fluid layer 400 and the second viscoelastic fluid layer 600 may be the same material or different materials. The first viscoelastic fluid layer 400 and the second viscoelastic fluid layer 600 both have shear thickening properties. The second viscoelastic fluid layer 600 may not have better optical properties than the first viscoelastic fluid layer 400. Because the second viscoelastic fluid layer 600 is disposed in the housing 100, the first viscoelastic fluid layer 400 is disposed between the cover window 300 and the flexible display panel 200, and thus the second viscoelastic fluid layer 600 does not affect an overall display performance of the flexible display device 10 compared to the first viscoelastic fluid layer 400.

The flexible display device 10 has many advantages such as being thin and easy to carry, and the embodiment of the present disclosure provides the first viscoelastic fluid layer 400 having shear thickening characteristics, which is flexible during normal bending and unfolding, and the first viscoelastic fluid layer 400 can coordinate a deformation of each film layer of the flexible display device 10, thereby eliminating a peeling during a bending process of the flexible display device 10. When the flexible display device 10 is subjected to external impact (such as falling ball, falling, etc.), it has strong resistance to external force, can improve a height of a screen falling ball, protect the hinge structure 500 of a bending mechanism from damage, and improve a life service life the flexible display device 10, user experiences are enhanced, and a mass production index of the flexible display device 10 is achieved, which is expected to bring high economic benefits to the flexible display industry.

Although the present disclosure is described via one or more embodiments, those of ordinary skill in the art can come up with equivalent variations and modifications based upon the understanding of the specification and the accompanying drawings. The present disclosure includes all such modifications and variations, and is only limited by the scope of the appended claims. In particular, as to the various functions performed by the components described above, the terms used to describe the components are intended to correspond to any component performing the specific functions (e.g., which are functionally equivalent) of the components (unless otherwise indicated), even those which are structurally different from the disclosed structure for performing the functions in the exemplary embodiments in the specification shown herein. In addition, although a particular feature in the specification is disclosed in only one of many embodiments, this feature may be combined with one or more features in other embodiments which are desirable and advantageous to a given or particular application. Moreover, the terms "include", "have", "consist of", or variations thereof used in the detailed description or the claims are intended to be used in a manner similar to the term "comprising".

In summary, although the preferable embodiments of the present disclosure have been disclosed above. It should be noted that those of ordinary skill in the art can make a variety of improvements and substitutions on the premise of not deviating from the technical principle of the present disclosure, and these improvements and substitutions should be encompassed within the protection scope of the present disclosure.

What is claimed is:

1. A flexible display device, comprising:
a housing;
a flexible display panel disposed on the housing;
a cover window disposed on the flexible display panel; and
a first viscoelastic fluid layer disposed between the cover window and the flexible display panel;
wherein a thickness of the first viscoelastic fluid layer is less than or equal to 25 μm; and
wherein a dispersion system of the first viscoelastic fluid layer comprises a plurality of reinforcing particles and an organic solvent, the reinforcing particles are distributed in the organic solvent, and a matrix structure of the first viscoelastic fluid layer is a fiber structure.

2. The flexible display device according to claim 1, wherein the flexible display panel comprises a flexible substrate, an organic light emitting layer, and an encapsulation layer disposed in sequence from bottom to top, and the first viscoelastic fluid layer is disposed between the cover window and the encapsulation layer.

3. The flexible display device according to claim 1, wherein the flexible display panel comprises a flexible substrate, an organic light emitting layer, an encapsulation layer, and a polarizer disposed in sequence from bottom to top, and the first viscoelastic fluid layer is disposed between the cover window and the polarizer.

4. The flexible display device according to claim 1, wherein the flexible display panel comprises a flexible substrate, an organic light emitting layer, an encapsulation layer, a polarizer, and a touch layer disposed in sequence from bottom to top, and the first viscoelastic fluid layer is disposed between the cover window and the touch layer.

5. The flexible display device according to claim 1, further comprising a hinge structure and a second viscoelastic fluid layer each disposed in the housing, wherein the hinge structure is disposed between the flexible display panel and the second viscoelastic fluid layer, the first viscoelastic fluid layer is a first non-Newtonian fluid layer, and the second viscoelastic fluid layer is a second non-Newtonian fluid layer.

6. The flexible display device according to claim 5, wherein materials of the first non-Newtonian fluid layer and the second non-Newtonian fluid layer comprise a polymer and a plurality of reinforcing particles.

7. The flexible display device according to claim 1, wherein a particle diameter of a single of the reinforcing particles is less than or equal to 10 μm.

8. The flexible display device according to claim 1, wherein a ratio of the reinforcing particles to the organic solvent is 2:1.

9. A flexible display device, comprising:
a housing;
a flexible display panel disposed on the housing;
a cover window disposed on the flexible display panel; and
a first viscoelastic fluid layer disposed between the cover window and the flexible display panel.

10. The flexible display device according to claim 9, wherein the flexible display panel comprises a flexible substrate, an organic light emitting layer, and an encapsulation layer disposed in sequence from bottom to top, and the first viscoelastic fluid layer is disposed between the cover window and the encapsulation layer.

11. The flexible display device according to claim 9, wherein the flexible display panel comprises a flexible substrate, an organic light emitting layer, an encapsulation layer, and a polarizer disposed in sequence from bottom to top, and the first viscoelastic fluid layer is disposed between the cover window and the polarizer.

12. The flexible display device according to claim 9, wherein the flexible display panel comprises a flexible substrate, an organic light emitting layer, an encapsulation layer, a polarizer, and a touch layer disposed in sequence from bottom to top, and the first viscoelastic fluid layer is disposed between the cover window and the touch layer.

13. The flexible display device according to claim 9, further comprising a hinge structure and a second viscoelastic fluid layer each disposed in the housing, wherein the hinge structure is disposed between the flexible display panel and the second viscoelastic fluid layer, the first viscoelastic fluid layer is a first non-Newtonian fluid layer, and the second viscoelastic fluid layer is a second non-Newtonian fluid layer.

14. The flexible display device according to claim 13, wherein materials of the first non-Newtonian fluid layer and the second non-Newtonian fluid layer comprise a polymer and a plurality of reinforcing particles.

15. The flexible display device according to claim 9, wherein a thickness of the first viscoelastic fluid layer is less than or equal to 25 μm.

16. The flexible display device according to claim 9, wherein a dispersion system of the first viscoelastic fluid layer comprises a plurality of reinforcing particles and an organic solvent, the reinforcing particles are distributed in the organic solvent, and a matrix structure of the first viscoelastic fluid layer is a fiber structure.

17. The flexible display device according to claim 16, wherein a particle diameter of a single of the reinforcing particles is less than or equal to 10 μm.

18. The flexible display device according to claim 16, wherein a ratio of the reinforcing particles to the organic solvent is 2:1.

* * * * *